United States Patent [19]

Kelley et al.

[11] Patent Number: 4,618,852

[45] Date of Patent: Oct. 21, 1986

[54] MONOTONIC A/D CONVERTER WHICH MINIMIZES CIRCUITRY FOR HIGH ORDER BIT CONVERSION

[75] Inventors: Stephen H. Kelley; Mathew A. Rybicki, both of Austin, Tex.

[73] Assignee: Motorola, Inc., Schaumburg, Ill.

[21] Appl. No.: 706,208

[22] Filed: Feb. 27, 1985

[51] Int. Cl.[4] ............................................. H03K 13/08
[52] U.S. Cl. ............................................. 340/347 AD
[58] Field of Search ..... 340/347 AD, 347 C, 347 SH, 340/347 M

[56] References Cited

U.S. PATENT DOCUMENTS 4,348,658 7/1982 Carter .......................... 340/347 M X
4,384,276 5/1983 Kelley et al. ................. 340/347 DA Primary Examiner—T. J. Sloyan
Attorney, Agent, or Firm—Anthony J. Sarli, Jr.; Jeffrey Van Myers; Robert L. King

[57] ABSTRACT

An N bit converter, where N is an integer, is provided for effecting A/D and D/A conversions by utilizing a capacitor array and a resistor voltage divider string. The converter may be linear or nonlinear and the structure remains monotonic independent of the accuracy of the converter. Although monotonic, device count is minimized and only $2^{(N/2)}$ stages are required to implement an N bit linear converter. Reduction of the number of circuit elements is achieved, in part, by shared use of decode circuitry for the most significant and least significant bits of the N bits.

20 Claims, 5 Drawing Figures

MONOTONIC A/D CONVERTER WHICH MINIMIZES CIRCUITRY FOR HIGH ORDER BIT CONVERSION

TECHNICAL FIELD

The present invention relates, in general, to A/D converters and D/A converters, and more particularly, to monotonic A/D and D/A converters.

BACKGROUND ART

In general, digital signal processing (DSP) systems utilize binary arithmetic and large linear number systems. Analog to digital converters are typically an essential element in DSP systems to allow the digital system to interface with an analog world. If a companded digital number, such as a PCM digital word, is utilized, a conversion from nonlinear to linear units may be effected by expanding the PCM word. However, a large amount of resolution is lost which results in a quantization error. The majority of DSP applications generally require a data word size of at least thirteen bits. Therefore, at least a twelve bit DAC which functions in the range of 100 KHz or about one microsecond per bit is commonly required. Typical monotonic A/D converters utilize R/2R resistor ladders or binarily weighted resistor ladders and require N stages for N bits where N is an integer. However, the accuracy in the last stage of such a converter is $(\frac{1}{2}^N)$. For a twelve bit system, the accuracy required in the twelfth stage is 1/(4,096) which is not typically feasible. To obtain the required accuracy in the twelve or thirteen bit area, thin film resistors which are trimmed are commonly used. However, using a trim technology substantially increases production costs. Furthermore, thin film resistors are not a pure CMOS process since thin film resistors require a resist material such as nichrome on the device surface and therefore may not readily interface with CMOS circuitry. Others have also used a "flash" converter which has a string of $2^N$ resistors for an N bit converter. A primary advantage of a flash converter is that the converter is monotonic and monotonicity is independent of the accuracy of the elements since each element in the flash converter represents one code point. However, such a converter is bit limited by the number and size of resistors associated with high order converters. For example, a twelve bit converter requires 4,096 resistors to implement. Therefore, a need exists in high bit applications for an N bit converter which exhibits the monotonicity characteristics of a flash converter but which requires fewer elements than $2^N$.

SUMMARY OF THE INVENTION

Accordingly, an object of the present invention is to provide an N bit converter, where N is an integer, which minimizes size and element count and performs A/D and D/A conversions.

Another object of the present invention is to provide an improved monotonic N bit A/D converter, where N is an integer, wherein monotonicity is independent of converter accuracy.

A further object of the present invention is to provide an improved monotonic N bit A/D converter, where N is an integer, which may also readily perform D/A conversions.

Yet a further object of the present invention is to provide an improved monotonic N bit A/D converter, where N is an integer, which minimizes processing steps required to implement the converter which is fully compatible with conventional CMOS processes.

In carrying out the above and other objects, there is provided, in one form, a converter for providing an N bit digital output signal corresponding to an analog input signal, where N is an integer. The most significant X bits of the N bits represent a plurality of chords defining a range of possible values of the analog input signal, where X is also an integer. The least significant (N-X) bits of the N bits represent a plurality of steps defining a range of possible step values of the analog input signal within any one of the chords. Charge redistribution means selectively store a charge which is proportional to the analog input and selectively redistribute the charge in response to the N bits. A plurality of capacitors having first interconnected electrodes and respective second electrodes are provided for the charge redistribution. A C rung switching network comprises a plurality of C rung switching elements with each switch coupled between the second electrode of a respective one of the capacitors and a common rail. Each C rung switching element couples a respective one of the first electrodes to the common rail in response to a predetermined one of a plurality of first select signals. A C rail switching network comprises a plurality of C rail switching elements with each switch coupled between the second electrodes of respective successive pairs of the capacitors. The C rail switches decouple, in response to the first select signals corresponding to each pair of capacitors, the second electrode from a selected one of the capacitors from the second electrodes of adjacent capacitors. In another form, the C rail and C rung switching structure described may be modified to another switching structure as described herein. Voltage divider means are coupled to the charge redistribution means for selectively redistributing the charge in response to the (N-X) bits and comprise resistance means coupled between first and second reference voltage terminals. The resistance means develop a predetermined step voltage on each of a plurality of step nodes. An R rung switching network comprising a plurality of R rung switches is provided wherein each switch is coupled between a respective one of the step nodes and the common rail. The R rung switches couple, in response to a predetermined one of a plurality of second select signals, one of the step voltages or the first or second reference voltage terminal to the common rail. A plurality of select logic means are coupled to the R rung and C rung switching networks for providing and latching the first or second select signals in response to a select control signal. Each of the select signals has a logic high or logic low value in response to a predetermined one of a plurality of decode control signals. A single one of X or one of (N-X) decoder, whichever is greater, is coupled to the select logic means for providing the decode control signals in response to the digital output signal.

DETAILED DESCRIPTION OF THE INVENTION

Figure 1A:
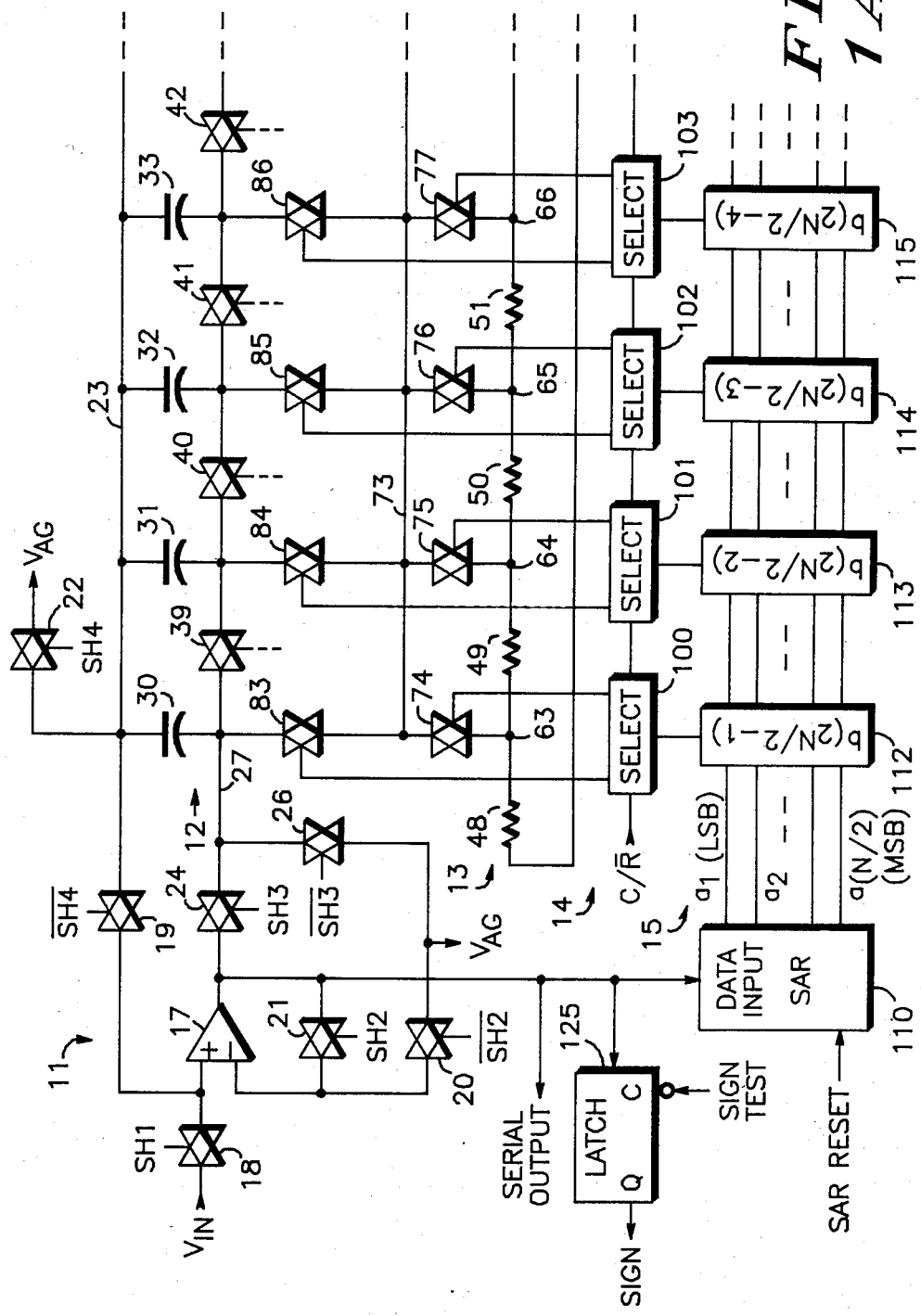
FIGS. 1(A) and 1(B) illustrate in partial schematic form an N bit converter, where N is an integer, in accordance with the present invention.

Shown in FIG. 1 is an N bit A/D converter 10 in accordance with the present invention having $2^{N/2}$ stages, where N is an integer. A common application of A/D converter 10 as a Cthe use of converter 10 as a twelve bit linear monotonic converter having sixty-four stages, where N equals twelve, to provide twelve data bits and a sign bit. In such an application, the most significant (N/2) or six bits of a digital approximation word represent $2^6$ or sixty-four linear chords assigned to a predetermined range of analog voltage values. The most significant bits are spread across the entire voltage range. As in a nonlinear PCM D/A converter, sixty-four capacitors which are representable by a six bit binary word may also be considered as representing a sixty-four bit word with each bit corresponding to a predetermined capacitor. The sixty-four bits in the present invention represent sixty-four chords in a linear analog chord approximation. In such a representation, "0" may represent a capacitor having a charge thereon not being switched to an associated analog circuit and "1" may represent a capacitor having the charge thereon being switched to the associated analog circuit. Therefore, from a structural standpoint as explained below, a sixty-four bit word has elements in it which are all "zeros" to the left and all "ones" to the right of a bit representing the capacitor which is assigned to the chord in which an analog sample falls within. The only change which can be effected by switching the capacitors is chord position. In other words, equal valued capacitors may be grouped in an array resulting in no monotonicity error due to common variation of element values because the array structure of equal valued components is inherently monotonic. The present invention further utilizes $2^{(N/2)}$ or $2^6$ resistors for a twelve bit converter in a "flash" resistor string converter structure. Each resistor represents a predetermined one of sixty-four divisions within each chord. Therefore, an A/D converter having the precision of $2^{12}$ or 4,096 elements for a twelve bit application but only requiring $2^7$ or 128 elements is provided. It should also be readily understood that the A/D converter of the present invention may also be used to readily perform D/A conversions as will be explained below.

A/D converter 10 generally comprises an integrator portion 11, a capacitor portion 12, a resistor portion 13, a select logic portion 14 and a decoder portion 15. It should be readily understood that the DAC structure of the present invention may be utilized with any external analog circuitry and is not limited to use only with the operational amplifier circuit shown. Further, all switches are illustrated as conventional CMOS transmission gates but may be implemented by other known switches. The present invention may also be used with a plurality of analog input integrating structures and is not restricted to the particular integrator illustrated.

Integrator portion 11 comprises an operational amplifier 17 having a noninverting input connected to both a first terminal of a switch 18 and to a first terminal of a switch 19. A second terminal of switch 18 receives an input analog voltage $V_{IN}$. Sample and hold control signals labeled "SH1" and "SH4" are coupled to control electrodes of switches 18 and 19, respectively. An inverting input of operational amplifier 17 is connected to first terminals of switches 20 and 21. A second terminal of switch 20 is connected to a reference voltage terminal for receiving a reference voltage, say analog ground $V_{AG}$. A second terminal of switch 21 is connected to an output of operational amplifier 17. A control signal labeled "SH2" and the complement thereof are coupled to control electrodes of switches 21 and 20, respectively. A second terminal of switch 19 is connected to a first terminal of a switch 22 at a first rail 23. A control signal labeled "SH4" and the complement thereof are coupled to control electrodes of switches 22 and 19, respectively. An output of operational amplifier 17 is connected to a first terminal of a switch 24, and a second terminal of switch 24 is connected to a first terminal of a switch 26 at a second rail 27. A second terminal of switch 26 is connected to the analog ground terminal for receiving voltage $V_{AG}$. A control signal labeled "SH3" and the complement thereof are coupled to control electrodes of switches 24 and 26, respectively.

In a preferred form, capacitor portion 12 generally comprises a plurality of $2^{(N/2)}$ equal valued capacitors such as capacitors 30, 31, 32, 33, 34, 35, 36, 37 and 38. Each capacitor of portion 12 has a first electrode connected to rail 23. Although a number of capacitors other than $2^{(N/2)}$ may be used, in a linear application $2^{(N/2)}$ is an optimum number where N equals the data bit size of converter 10. The variability of the number of capacitors is shown by the dashed lines of FIG. 1. Each capacitor of the plurality of $2^{(N/2)}$ capacitors has a second electrode connected to a predetermined tap of second rail 27, and the second electrodes of capacitors 30–38 are selectively interconnected via a plurality of rail switches 39–46.

Resistor portion 13 comprises a plurality of series-connected resistors, such as resistors 48–56, which are interconnected via a plurality of taps 63–71. In a preferred form, converter 10 comprises $2^{(N/2)}$ stages in which each stage has one capacitor and one resistor. In a linear application, all resistors are substantially equal valued. A first terminal of resistor 48 is connected to a terminal 60 which is selectively coupled to either a negative reference voltage $-V_{REF}$ or a positive reference voltage $+V_{REF}$ via a switch 61. A second terminal of resistor 48 is connected to tap 63. A first terminal of resistor 56 is connected to tap 71 which is connected to the analog ground terminal for receiving voltage $V_{AG}$, and a second terminal of resistor 56 is connected to tap 70. Taps 63–71 are each selectively connected to a third rail 73 via a plurality of switches 74–82, respectively. The third rail 73 is selectively connected to a predetermined second electrode of capacitors 30–38 via switches 83–91, respectively. A NOR gate 93 has a first input connected to a control electrode of switch 91, a second input coupled to a control signal labeled "SH5", and an output connected to a control electrode of switch 61. A NOR gate 94 has a first input connected to the first input of NOR gate 93, a second input connected to a control electrode of switch 90, and an output connected to a control electrode of switch 46. Each of switches 39, 40, 41, 42, 44 and 45 has a control electrode connected to an output of a NOR gate (not shown) analogous to a NOR gate 95 which has an output connected to a control electrode of switch 43. A first input of NOR gate 95 has a first input connected to a signal labeled QC(K−1), and a second input connected to a signal labeled QC(K) to be explained below in connection with FIGS. 2 and 3. In the illustrated form, switches 39–46 may be viewed as capacitor or C rail switches. Switches 83–91 may be viewed as C rung switches, and switches 74–82 may be viewed as resistor or R rung switches.

Select logic portion 14 comprises, in a preferred form, $2^{(N/2)}$ latch select circuits such as latch select circuits 100–108. Each of latch select circuits 100–108 has a control input coupled to a capacitor/resistor control signal labeled C/$\overline{R}$, and each of circuits 100–108 has first and second outputs, or C and R outputs, respectively, and an input. The first or C output of each of latch select circuits 100–108 is respectively connected to a control electrode of switches 83–91. The second or R output of each of latch select circuits 100–108 is respectively connected to a control electrode of switches 74–82.

Decoder portion 15 comprises a successive approximation register (SAR) 110 and, in a preferred form, a plurality of $2^{(N/2)}$ decode circuits illustrated in abbreviated detail by decode circuits 112–120. An output of operational amplifier 17 is connected to a data input of successive approximation register 110. A successive approximation register control signal labeled "SAR RESET" is coupled to a second input of SAR 110. SAR 110 has (N/2) decode outputs labeled "$a_1$" thru "$a_{(N/2)}$" which are each connected to decode inputs of decode circuits 112–120. Decode circuits 112–120 each represent a ranked ordered decode word labeled from the highest rank of "$b_{[2(N-2)-1]}$" to $b_0$. Decode circuits 112–120 each have an output connected to an input of latch select circuits 100–108, respectively. Decode circuit 120 also has an additional input coupled to a control signal labeled "SH0".

A latch circuit 125 has an output for providing a sign bit. In a preferred form, latch circuit 125 may be implemented with a conventional flip flop circuit having a clock input coupled to a sign test signal. A data input is connected to the output of operational amplifier 17.

Converter circuit 10 may be viewed as comprising $2^{(N/2)}$ stages such as stage 130 which is separated from other stages by the dashed lines of FIG. 1. Stage 130 of FIG. 3 will be discussed in more detail after a discussion of the operation of converter 10.

Figure 2:
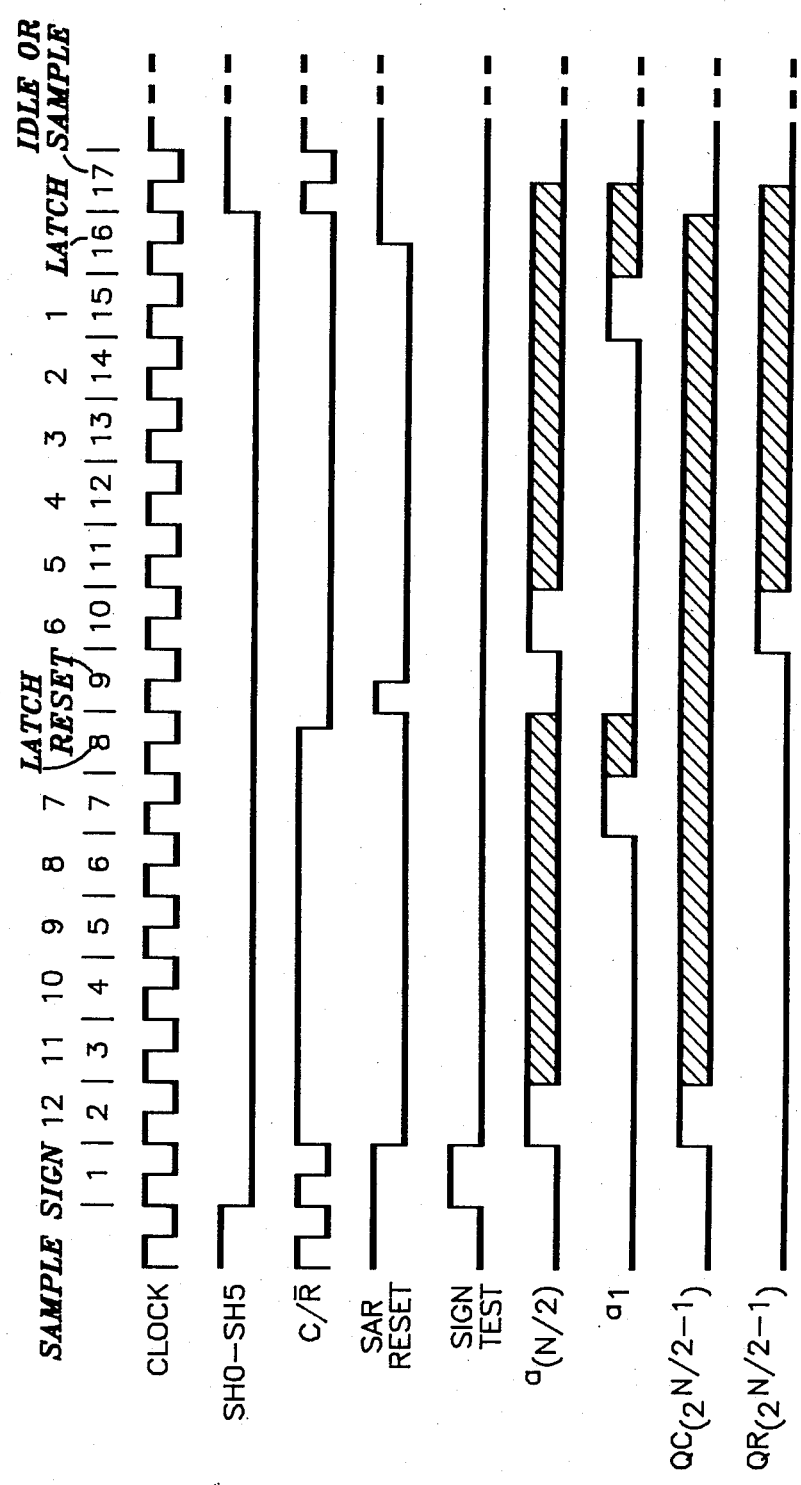
FIG. 2 illustrates in graphical form timing signals associated with the converter of FIG. 1.

Referring to FIG. 2, the circuit operation may be more readily understood in connection with the control signals associated with converter 10. Shown at the top of the timing signals is a characterization of each bit period defined by a cycle of a system clock. In the illustrated example, a sign bit and twelve data bits are provided within fifteen system clock cycles. Initially, an analog input voltage $V_{IN}$ is sampled for conversion to a digital value. During a sample period, each of the sample signals SH0, SH1, SH2, SH3, SH4 and SH5 is in a logic high condition in response to the presence of a master convert command signal not shown. Simultaneously, SAR 110 is reset to decode all logic zeroes by placing the SAR reset signal at a logic high level. The net effect of the control signals is to place operational amplifier 17 in a unity gain configuration where the sampled input voltage is coupled to the output of operational amplifier 17 and analog ground is connected to first rail 23. The input voltage is then connected to each of the second or lower electrodes of capacitors 30–38 where the input sample is charge shared onto the array of capacitors as will be described immediately below. By decoding all logic zeroes in response to the SAR reset signal, SAR 110 does not activate any of decode circuits 112–119 and activates decode circuit 120. However, the complement of sample signal SH0 which is at a logic low level is coupled to decode circuit 120 which forces decode circuit 120 to also be unselected. Therefore, latch select circuits 100–108 do not activate any of switches 74–82 or switches 83–91 regardless of the logic state of the C/$\overline{R}$ control signal during the sample phase. The control electrodes of switches 39–46 are all connected to an output of a NOR logic gate such as switch 43 connected to NOR gate 95 and switch 46 connected to NOR gate 94. As long as SAR 110 does not select any of decode circuits 112–120, the outputs of all NOR gates having the outputs thereof connected to control electrodes of switches 39–46 will be at a logic high level thereby connecting the lower electrodes of all of capacitors 30–38. Therefore, the input voltage is charge sampled onto all of capacitors 30–38 as mentioned above. The control of switches 39–46 will be discussed in detail below by further illustrating stage 130 in FIG. 3.

After an input voltage has been charge shared onto the array of capacitors 30–38, a sign bit determination of the sampled voltage is made during the next clock cycle. Therefore, all sample control signals SH0–SH5 transition to a low logic level to indicate an end of the sample period. As a result, operational amplifier 17 is disconnected from unity gain configuration, and the negative input is connected to analog ground potential. The positive input of operational amplifier 17 is disconnected from the input voltage and connected to the top electrodes of capacitors 30–38. The output of operational amplifier 17 is disconnected from the lower electrodes of capacitors 30–38 and connected to the data input of SAR 110 and to the sign input of latch circuit 125. Coupling the lower electrodes of the array of capacitors 30–38 to analog ground translates the charge existing on the capacitors without varying the charge. Since the top electrodes of the capacitor array are connected to the positive or noninverting output of operational amplifier 17, the output of operational amplifier 17 provides the sign bit. If the output of operational amplifier 17 is a logic "1" having a voltage level below $V_{AG}$, the sign of the sampled input is positive. If the output of operational amplifier 17 is a logic "0" having a voltage level above $V_{AG}$, the sign of the sampled input is negative. The sign bit is outputted by latch circuit 125 in response to the sign test signal which is at a logic high level only during the sign bit interval. Simultaneously, during the sign bit period, the C/$\overline{R}$ control signal is initially at a high logic level and the SAR reset signal remains at a high logic level so that decode circuit 120 is now selected. In response, latch select circuit 108 couples a logic high level signal to each of the control electrode of switch 91, the second input of NOR gate 93 and the first input of NOR gate 94, and a logic low level signal is coupled to the control electrode of switch 82. Before switch 91 becomes conductive, switch 46 is made nonconductive. This order of switching action is accomplished by the logic design of each stage as will be illustrated by the discussion associated with FIG. 3. The high logic level on the control electrode of switch 91 is latched by circuit 108 and remains as long as decode circuit 120 is selected by SAR 110. The high logic level at the second input of NOR gate 93 guarantees that switch 61 remains nonconductive during the sign bit interval. During a second half of the clock signal in the sign bit interval, the C/$\overline{R}$ control signal transitions to a low logic level which makes latch select circuit 108 couple a high logic level to the control electrode of switch 82, thereby connecting the lower electrode of capacitor 38 to analog ground potential via switches 91 and 82. Although the remainder of the capacitors of the array have the lower electrodes connected to analog ground before the lower electrode of capacitor 38 is connected to analog ground, no error results in the sign magnitude calculation since the polarity of the voltage across all capacitors of the array is the same.

Once again referring to FIG. 2, at the end of the sign bit cycle, the next six cycles are used to calculate the six MSBs of the digital data which are serially outputted. The six MSBs represent one of sixty-four chords within which the analog value sampled onto capacitors 30–38 falls within. Accordingly, only capacitor portion 12 is used in determining the six MSBs and the C/$\overline{R}$ control signal transitions to a high logic value. Simultaneously, the SAR reset signal disappears and SAR 110 is permitted to begin a conventional binary successive approximation or binary search. SAR 110 begins the successive approximation by selecting the $2^{(N/2)}$th decoder circuit which is located in the section which interfaces with the middle of the converter. Assume for the purpose of illustration that the $2^{(N/2)}$th decoder is decoder 116 labeled $b_K$. When decoder circuit 120 becomes deselected and the C/$\overline{R}$ control signal transitions to a high logic level, the C output of select circuit 108 which is connected to the control electrode of switch 91 is no longer latched at a high logic level and transitions to a low logic level because decode circuit 120 is no longer selected. A very short delay period later, switches 46 and 61 become conductive as a result of all the inputs to NOR gates 93 and 94 being at a low logic level. Logic circuitry external to converter 10 causes either a positive reference voltage or a negative reference voltage to be coupled to switch 61 in response to the sign bit which was provided in the immediately preceding clock cycle. Therefore, a reference voltage is coupled to the lower electrodes of capacitors 35, 36, 37 and 38. Simultaneously, the lower electrode of capacitor 34 is being disconnected from the lower electrodes of capacitors 35, 36, 37 and 38 by making switches 42 and 43 nonconductive assuming for the purpose of illustration that there are in fact no identical intervening stages coupled between capacitors 33 and 34. The R output of select circuit 108 remains latched at a high logic level until the C/$\overline{R}$ control signal transitions to a low logic level. Therefore switch 82 remains conductive. After switches 42 and 43 have been made nonconductive, switch 87 is made conductive a short delay time later. Therefore, the lower electrode of capacitor 34 is disconnected from all the other capacitors and is connected to analog ground via switches 87 and 82. The lower electrodes of all other capacitors 30, 31, 32 and 33 remain connected together and connected to analog ground thru switch 26. As a result of the switching during the first data bit cycle, a plurality of capacitors equal to one less than half the capacitors of converter 10 is charged to a reference voltage of correct polarity and compared by operational amplifier 17 with analog ground potential. If the output of operational amplifier 17 is a logic "one", this means that the comparator stage did not trip indicating that the reference voltage charged onto capacitors 35, 36, 37 and 38 was not greater than the sampled input voltage. Therefore, the MSB is provided as a "1". If, however, the output of operational amplifier 17 is a logic "zero", this means that the comparator stage did trip indicating that the reference voltage charged onto capacitors 35, 36, 37 and 38 was greater than the sampled input voltage.

Therefore, the MSB is provided at the decode output labeled "$a_{(N/2)}$" as a "0". Shown in FIG. 2 is the value of the MSB which is provided in a twelve data bit plus sign bit application as the twelveth data bit provided during a cycle labeled "2". The MSB is held by latch circuit 125 as either a "1" or "0" as shown by the cross-hatching until the end of a latch cycle labeled as the eighth cycle. SAR 110 then continues a conventional binary successive approximation to calculate five remaining MSBs representing a chord value during cycles labeled 3, 4, 5, 6 and 7. Which decode circuit is selected next in the binary search is dependent upon what the preceding data bit was. For example, if a "0" is obtained as a data bit, SAR 110 in executing the binary search selects the next higher ranked decode circuit to the left for the next bit calculation. Conversely, if a "1" is obtained as a data bit, SAR 110 in executing the binary search selects the next lower ranked decode circuit to the right for the next bit calculation. For example, assume decode circuit 119 labeled $b_1$ is selected and a value of "1" for the next to last of the MSBs has been provided by operational amplifier 17. In response, SAR 110 deselects decode circuit 119 and selects decode circuit 120 during the cycle labeled "7". Switches 46 and 61 are made nonconductive and switches 91 and 82 couple the lower electrode of capacitor 38 to analog ground. The sampled charge on only capacitor 38 is then compared with analog ground by operational amplifier 17 and provided as bit $a_1$ which is the least significant bit of the MSBs.

During a latch period illustrated in FIG. 2, the data MSBs are read from the outputs of SAR 110 and SAR 110 is reset by the reset control signal. During the latch period, the C/$\overline{R}$ control signal also transitions to a low logic level which latches all the C outputs of select circuits 100-108 and resets all the R outputs of select circuits 100-108 to logic zero. A calculation of the LSBs representing a step value now occurs. At this point, one of $2^{(N/2)}$ chords in which the sampled input voltage falls within has been located and the LSBs will define a particular one of $2_{(N/2)}$ steps within the chosen chord which most exactly approximates the sampled input voltage. Again, SAR 110 functions by effecting a conventional binary search in which a midpoint value is first chosen by selecting a midpoint decode circuit such as decode circuit 116. When decode circuit 116 is selected in a binary search, the R output of select circuit 104 transitions to a high logic level since the C/$\overline{R}$ control signal is at a low logic level. Switch 78 becomes conductive which couples resistor tap 67 to the lower electrode of the capacitors of capacitors 30-38 which had a "1" value in the binary search for the MSBs and which were used to determine the correct chord position. Resistor tap 67 has a predetermined portion of the reference voltage coupled to tap 67 via switch 61. Operational amplifier 17 compares the amount of resulting coupled voltage with analog ground during the binary search to determine whether or not the amount of reference voltage chosen is greater or less than the sampled input voltage. In response to the resulting output of operational amplifier 17, an adjacent decode circuit either immediately to the left or to the right of decode circuit 116 is selected next. The binary search is then completed and six LSBs representing a step value are calculated during clock cycles 10 thru 15. The most signifiant bit of the LSBs is provided in cycle 10 during the binary search as shown in FIG. 2 by the bit labeled $a_{(N/2)}$, and the least significant bit is provided in cycle 15 by the bit labeled $a_1$. The LSBs are latched during cycle 16 and SAR 110 is reset. Cycle 17 is either an idle cycle or a sample cycle in which another sample of the input voltage is sampled by capacitors 30-38. Repetition of the circuit operation as described above occurs.

Figure 1B:
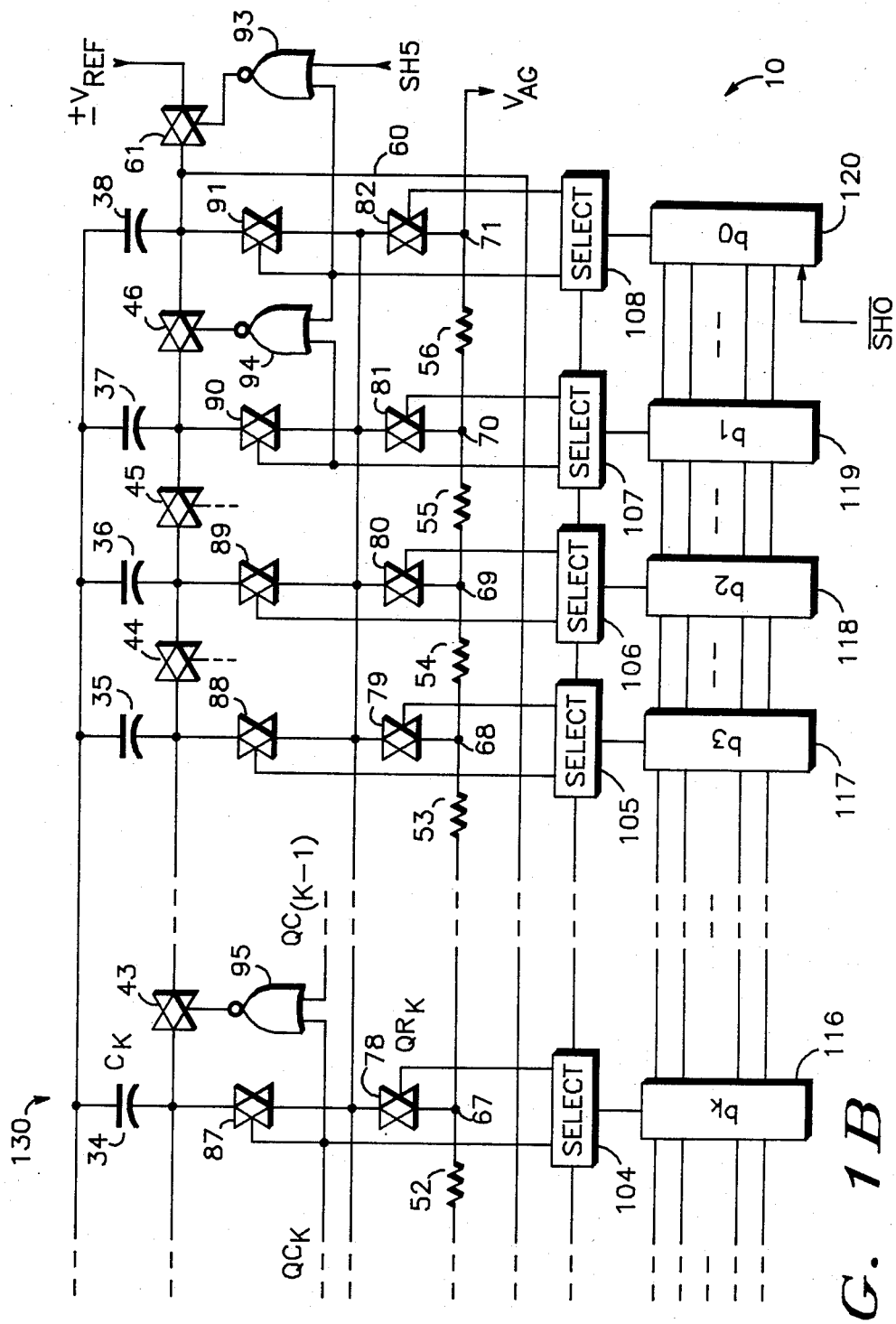
Figure 3:
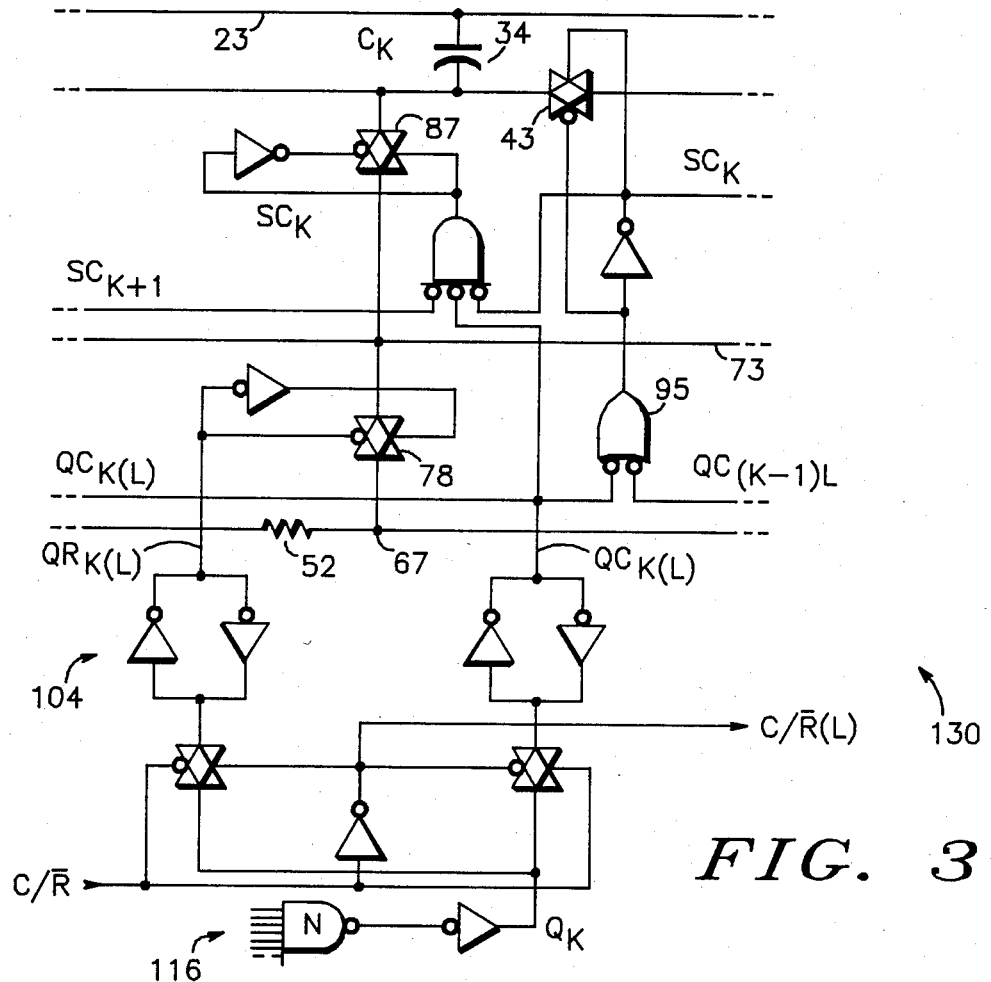
FIG. 3 iillustrates in partial schematic form a detail of a stage of the converter of FIG. 1.

Shown in FIG. 3 is a detailed schematic of stage 130 of FIG. 1 which is illustrated as a Kth stage. Circuit elements which are common between FIGS. 1 and 3 are numbered identically. All stages which comprise converter 10 are substantially identical. However, logic can be simplified by using inverting logic between stages. Therefore, in a preferred form, odd and even stages differ by using opposite logic levels. It can be readily seen that decode circuit 116 may be implemented as an (N/2) input NAND gate to provide an output labeled "$Q_K$". Select circuit 104 may be implemented by a pair of conventional latch circuits which respectively provide an R output labeled "QRK(L)" and a C output labeled "QCK(L)" in response to the C/R control signal. Signals QCK(L) and QRK(L) are illustrated in FIG. 2 for the data bits corresponding to cycles 2 and 10, respectively. Signals $SC_{(K+1)}$ and $SC_K$ which are not shown in FIG. 1 are also generated by the logic and interconnected among stages for proper operation. As mentioned previously, each stage is preferably designed so that the switches which interconnect the lower electrodes of the capacitors of the array, such as switch 43, are made nonconductive before the switches which connect the lower electrodes to the reference voltage, such as switch 87, become conductive. This insures that only the correctly chosen capacitors are connected to the reference voltage potential when a conversion is being effected. However, the present invention may be implemented with each stage having only the logic circuitry illustrated for stage 130 in FIG. 1(B). Although switches 87 and 43 may be conductive for a short time period of a clock cycle of overlap, no output error results provided the capacitor rung switches are high impedance switches.

By now it should be apparent that converter 10 is capable of performing an N bit conversion using only $2^{(N/2)}$ stages with only one capacitor and one resistor per stage. Further, the control logic associated with each stage has been simplified to provide a regular structured converter which is monotonic. Monotonicity results from the fact that in the capacitor array, all capacitors are of equal value and stacked so that all capacitors are evenly charged with an input sample. Therefore, capacitor value variations resulting from processing variations do not affect the monotonicity of the converter. The capacitor array forms a ladder configuration in which connected first electrodes form one rail, the capacitors form rungs of the ladder, and the selectively interconnected second electrodes form a second rail which is selectively divided. In the resistor portion of the converter, a flash type of converter is utilized which is monotonic because each tap of the resistor string is a predetermined amount of voltage potential different from adjacent taps. Since resistors are connected in series, processing variations affecting the value of resistors do not affect the converter's monotonicity.

The present invention may also be utilized to perform a digital to analog conversion of a digital input code. Initially, both top and bottom electrodes of the capacitor array are connected to ground potential to fully discharge the array. External logic circuitry couples either the positive or the negative reference voltage to switch 61 in response to a sign bit input. The (N/2) MSBs of the digital input word are coupled to SAR 110 which selects predetermined ones of decode circuits 112-120 in response thereto. In response to the activation of any of decode circuits 112-120, corresponding select circuits of select circuits 100-108 respectively enable corresponding switches of switches 83-91 during a high logic level of the C/R control signal. Therefore the lower electrode of predetermined capacitors of capacitors 30-38 are connected to the chosen reference voltage and a voltage exists at rail 23 which is equivalent to the MSBs of the digital input code. SAR 110 is then reset and loaded with the LSBs of the digital input. Simultaneously, the C/R control signal transitions to a low logic level. A portion of the R outputs of specific select circuits of circuits 100-108 corresponding to the digital input code are latched to a high logic level which selectively couples a predetermined portion of the reference voltage via the resistor string to a corresponding capacitor of the capacitor array. Therefore, the voltage at the first or top electrodes of capacitors 30-38 represents an analog fraction of the reference voltage corresponding to the digital input code. The converted analog voltage may, if so desired, be amplified by charge sharing the converted voltage onto a charge storage amplifier switched capacitor stage (not shown).

Figure 4:
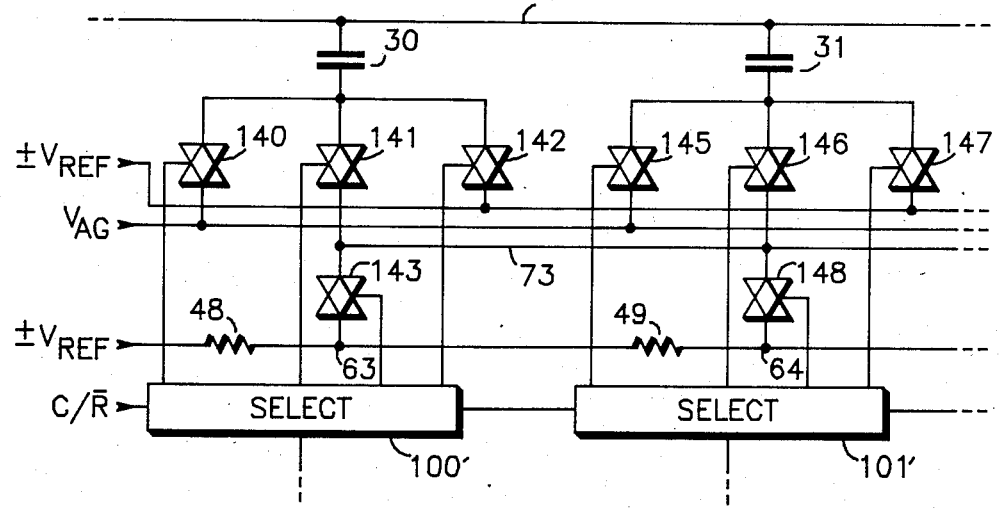
FIG. 4 illustrates in partial schematic form another embodiment of a portion of the converter of FIG. 1.

Shown in FIG. 4 is a modification of the switch structure associated with switches 83-91 and 39-46 which may be implemented for applications where speed is more important than device count and size. In particular, in the rung and ladder configuration of the capacitor array shown in FIG. 1, converter 10 is somewhat time limited for high speed applications in charging the capacitors to the reference voltage due to settling times associated with the RC networks. Therefore, to minimize the time required to charge the capacitors of converter 10, each lower electrode of the capacitors may be connected to a three way switch. In other words, each lower electrode may be connected to analog ground, to the reference voltage or to the string of resistors 48-56. In the embodiment shown, the three-way switch is shown by four CMOS transmission gates. In particular, the lower electrode of capacitor 30 is connected to first terminals of switches 140, 141 and 142. Similarly, the lower electrode of capacitor 31 is connected to first terminals of switches 145, 146 and 147. A second terminal of each of switches 140 and 145 are connected together and coupled to analog ground potential. A second terminal of each of switches 141 and 146 are connected together and respectively connected to first terminals of switches 143 and 148. A second terminal of switch 143 is connected to tap 63, and a second terminal of switch 148 is connected to tap 64. A second terminal of each of switches 142 and 147 are connected together and coupled to a predetermined reference voltage. Control electrodes of switches 140, 141, 142 and 143 are respectively connected to first, second, third and fourth outputs of a select circuit 100'. Control electrodes of switches 145, 146, 147 and 148 are respectively connected to first, second, third and fourth outputs of a select circuit 101'. Other common circuit elements between FIG. 4 and FIG. 1 are similarly numbered. The advantage provided by the switching structure of FIG. 4 is that the switches provide for charging only one capacitor when a stage is connected to the reference voltage instead of charging an interconnected plurality of capacitors. Therefore, speed is improved. However, an additional switch per stage is required, and additional control logic is associated with select circuits 100' and 101' than is required of select circuits 100 and 101. When comparing the different switching structures of FIGS. 1 and 4, it should be apparent that R rung switch 74 is functionally equivalent to switch 143. However, C rung switch 74 and C rail switch 39 have been functionally replaced by switches 140, 141 and 142 to accomplish the alternative objective discussed above.

By now it should be apparent that the present invention provides a monotonic converter for performing A/D and D/A conversions for high ordered bit conversions without using a large number of components. The converter uses both a linear capacitor portion which is inherently monotonic and a resistor portion arranged in a flash configuration which is also inherently monotonic. The two portions are utilized by switches which isolate a lower electrode of a predetermined capacitor from two other portions of capacitors. The predetermined capacitor represents the chord in which an analog voltage falls within. Once the correct chord has been determined, the switching structure permits a monotonic determination of a correct digital step most closely approximating the analog voltage. Although the converter is illustrated as a linear converter, it should be readily apparent that the structure of the converter may be utilized in a nonlinear converter such as a logarithmic or companded DAC. It should also be realized that the present invention may be practised by using a number of resistors in the resistor string other than $2^{(N/2)}$ resistors or also differing from the number of capacitors used. In such an application, if an N bit converter is provided using $2^{(N-X)}$ capacitors and $2^X$ resistors, the size of decode portion may be reduced by using only a one of X or a one of (N-X) decoder, whichever of X or (N-X) is greater, instead of a one of N decoder. Since only $2^{(N/2)}$ capacitors and $2^{(N/2)}$ resistors are required for a monotonic linear N bit converter rather than $2^N$ capacitors and $2^N$ resistors, a large reduction in the number of devices required to attain monotonicity has been obtained. Further, a substantial savings in decode logic has been realized by the fact that the select logic provides the ability to share the same decoder for chord and step calculations. This is a substantial savings in decode logic as compared with known converter structures such as the converter taught by Robert Allgood et al. in U.S. Pat. No. 4,383,277 entitled "Digital to Analog Converter" and assigned to the assignee hereof. Shared or multiplexed use of decode logic in the present invention further minimizes area in high order bit monotonic converters.

We claim:

1. A converter for providing an N bit digital output signal corresponding to an analog input signal, where N is an integer, the most significant X bits of the N bits representing a selected one of a plurality of chords defining a range of possible values of the analog input signal and the least significant (N-X) bits of the N bits representing a selected one of a plurality of steps defining a range of possible step values of the analog input signal within any one of the chords, where X is also an integer, comprising:

charge redistribution means for selectively storing a charge proportional to the analog input and selectively redistributing the stored charge in proportion to the N bits, comprising:
a plurality of capacitors having first interconnected electrodes and respective second electrodes, for selectively redistributing an amount of the stored charge corresponding to the N bits;
a C rung switching network comprising a plurality of C rung switching elements, each coupled between the second electrode of a respective one of the capacitors and a common rail, for coupling the respective one of the second electrodes to the common rail in response to a predetermined one of a plurality of first select signals; and
a C rail switching network comprising a plurality of C rail switching elements, each coupled between the second electrodes of respective successive pairs of the capacitors, for decoupling, in response to the first select signals corresponding to each successive pair of capacitors, the second electrode of a selected one of the capacitors from the second electrodes of adjacent capacitors;

voltage divider means coupled to the charge redistribution means for selectively further redistributing the stored charge corresponding to the (N-X) bits, comprising:
resistance means coupled between first and second reference voltage terminals, for developing on each of a plurality of step nodes a predetermined step voltage; and
an R rung switching network comprising a plurality of R rung switching elements, each coupled between a respective one of the step nodes and the common rail, for coupling, in response to a predetermined one of a plurality of second select signals, one of the step voltages or said first reference voltage terminal to the common rail;

a plurality of select logic means coupled to the R rung and C rung switching networks for providing the pluralities of first and second select signals, each of said select signals having a logic high or low value in response to a predetermined one of a plurality of decode control signals; and a single one of X or one of (N-X) decoder, whichever is greater, coupled to the select logic means for providing the decode control signals in response to an approximation of the digital output signal.

2. The converter of claim 1 wherein N is an even integer, the number X is equal to N/2, the number of chords equals $2^{(N/2)}$, and the number of steps equals $2^{(N/2)}$.

3. The converter of claim 2 wherein the plurality of capacitors comprises $2^{(N/2)}$ capacitors of substantially equal value.

4. The converter of claim 2 wherein the resistance means comprise $2^{(N/2)}$ resistors of substantially equal value.

5. The converter of claim 1 wherein the C rung switching elements, the C rail switching elements and the R rung switching elements are CMOS transmission gates.

6. The converter of claim 1 further comprising:
comparator means coupled to the plurality of capacitors, for comparing the polarity of the input signal stored by the capacitors with a third reference voltage terminal to provide a sign bit, and for evaluating the charge redistribution to provide the digital output signal.

7. The converter of claim 6 further comprising:
successive approximation register means coupled to both the decoder and the comparator means, for supplying the approximation of the digital output signal and providing the digital output signal in response to the comparator means.

8. A converter for providing an N bit digital output signal corresponding to an analog input signal, where N is an integer, the most significant X bits of the N bits representing a selected one of a plurality of chords defining a range of possible values of the analog input signal and the least significant (N-X) bits of the N bits representing a selected one of a plurality of steps defining a range of possible step values of the analog input signal within any one of the chords, where X is also an integer, comprising:

charge redistribution means for selectively storing a charge proportional to the analog input and selectively redistributing the stored charge in proportion to the N bits, comprising:
a plurality of capacitors having first interconnected electrodes and respective second electrodes, for selectively redistributing an amount of the stored charge corresponding to the N bits;
capacitor switching means coupled to the second electrodes of the capacitors for selectively connecting, in response to a predetermined one of a plurality of either first, second or third control signals, a predetermined one of each of the second electrodes to one of respectively a first reference voltage terminal, a second reference voltage terminal or a common rail;
voltage divider means coupled to the charge redistribution means for selectively redistributing the charge in response to the (N-X) bits, comprising:
resistance means coupled between first and second reference voltage terminals, for developing on each of a plurality of step nodes a predetermined step voltage; and
a resistance switching network comprising a plurality of resistance switching elements, each coupled between a respective one of the step nodes and the common rail, for coupling, in response to a predetermined one of a fourth plurality of select signals, one of the step voltages or said second reference voltage terminal to the common rail;
a plurality of select logic means coupled to the capacitance switching means and to the resistance switching network, for providing the pluralities of first, second, third and fourth select signals, each of said select signals having a logic high or logic low value in response to a predetermined one of a plurality of decode control signals; and
a single one of X or one of (N-X) decoder, whichever is greater, coupled to the select logic means for providing the decode control signals in response to an approximation of the digital output signal.

9. The converter of claim 8 wherein said capacitor switching means further comprise:
a first capacitor switching network comprising a first plurality of capacitance switching elements, each coupled between the second electrode of a respective one of the capacitors and a common rail, for coupling a respective one of the first electrodes to the common rail in response to a predetermined one of a plurality of first select signals;
a second capacitor switching network comprising a second plurality of capacitance switching elements, each coupled between the second electrode of a respective one of the capacitors and a first reference voltage terminal, each selectively coupling the second electrode of a predetermined capacitor to the first reference voltage terminal in response to a predetermined one of a plurality of second select signals; and
a third capacitor switching network comprising a third plurality of capacitance switching elements, each coupled between the second electrode of a respective one of the capacitors and a second reference voltage terminal, each selectively coupling the second electrode of a predetermined capacitor to the second reference voltage terminal in response to a predetermined one of a plurality of third select signals.

10. The converter of claim 8 wherein N is an even integer, the number X is equal to N/2, the number of chords equals $2^{(N/2)}$, and the number of steps equals $2^{(N/2)}$.

11. The converter of claim 8 wherein the plurality of capacitors comprises $2^{(N-X)}$ capacitors of substantially equal value.

12. The converter of claim 8 wherein the plurality of capacitors comprises $2^{(N/2)}$ capacitors of sustantially equal value.

13. The converter of claim 8 wherein the resistance means comprise $2^{(X)}$ resistors of substantially equal value.

14. The converter of claim 8 wherein the resistance means comprise $2^{(N/2)}$ resistors of substantially equal value.

15. The converter of claim 8 wherein all switching elements are CMOS transmission gates.

16. The converter of claim 8 further comprising:
comparator means coupled to the plurality of capacitors, for comparing the polarity of the input signal stored by the capacitors with a third reference voltage terminal to provide a sign bit, and for evaluating the charge redistribution to provide the digital output signal.

17. The converter of claim 16 further comprising:
successive approximation register means coupled to both the decoder and the comparator means, for supplying an approximated digital output signal and providing the digital output signal in response to the digital output signal.

18. In a converter for providing an N bit digital output signal corresponding to an analog input signal, the most significant X bits of the N bits representing a selected one of a plurality of chords defining a range of possible values of the analog input signal and the least significant (N-X) bits of the N bits representing a selected one of a plurality of steps defining a range of possible step values of the analog input signal within any one of the chords, where N and X are integers, a method for converting comprising the steps of:
charge sharing the input signal onto a plurality of capacitors having interconnected first electrodes and selectivel second electrodes;
providing a single one of X or a one of (N-X) decoder, whichever is greater, to successively approximate the most significant X bits of the output signal;
successively comparing a predetermined reference voltage with each of a plurality of chord approximation voltages at the first electrodes of the capacitors, each of said chord approximation voltages being proportional to a charge redistribution of the shared charge on a predetermined portion of the capacitors corresponding to a predetermined one of each of the approximated X most significant bits, to provide each of the X bits;

sharing the same single decoder to successively approximate the least (N-X) bits; and successively comparing the reference voltage with each of a plurality of step approximation voltages at the first electrodes of the capacitors, each of said step approximation voltages being proportional to charge redistribution of the shared charge on a predetermined portion of the capacitors corresponding to a predetermined one of each of the approximated (N-X) least significant bits, to provide each of the (N-X) bits.

19. The converter of claim 18 wherein the plurality of capacitors comprises $2^{(N-X)}$ capacitors of substantially equal value.

20. The converter of claim 18 wherein the plurality of capacitors comprises $2^{(N/2)}$ capacitors of substantially equal value.

* * * * *